(12) United States Patent
Gurgi et al.

(10) Patent No.: US 8,869,009 B2
(45) Date of Patent: Oct. 21, 2014

(54) READ COMMANDS SPECIFYING ERROR PERFORMANCE

(71) Applicant: Apple Inc., Cupertino, CA (US)

(72) Inventors: Eyal Gurgi, Herzeliya (IL); Tomer Ish-Shalom, Herzeliya (IL)

(73) Assignee: Apple Inc., Cupertino, CA (US)

( * ) Notice: Subject to any disclaimer, the term of this patent is extended or adjusted under 35 U.S.C. 154(b) by 108 days.

(21) Appl. No.: 13/764,083

(22) Filed: Feb. 11, 2013

(65) Prior Publication Data

US 2014/0229794 A1    Aug. 14, 2014

(51) Int. Cl.
*G11C 29/00* (2006.01)
*H03M 13/00* (2006.01)
*G06F 11/10* (2006.01)
*H03M 13/35* (2006.01)

(52) U.S. Cl.
CPC ............ *G06F 11/10* (2013.01); *G06F 11/1008* (2013.01); *H03M 13/35* (2013.01); *G06F 11/1068* (2013.01)
USPC .......................................... 714/773; 714/774

(58) Field of Classification Search
CPC . G06F 11/1068; G06F 11/1008; H03M 13/35
USPC ................................................ 714/773, 774
See application file for complete search history.

(56) References Cited

U.S. PATENT DOCUMENTS

| | | | | |
|---|---|---|---|---|
| 5,758,050 | A | * | 5/1998 | Brady et al. ................. 714/1 |
| 6,038,679 | A | * | 3/2000 | Hanson ...................... 714/5.1 |
| 6,094,459 | A | * | 7/2000 | Kao et al. ................... 375/295 |
| 7,559,004 | B1 | * | 7/2009 | Chang et al. ............... 714/758 |
| 7,958,433 | B1 | * | 6/2011 | Yoon et al. ................. 714/774 |
| 8,341,503 | B1 | * | 12/2012 | Yoon et al. ................. 714/774 |
| 8,458,568 | B2 | * | 6/2013 | Cideciyan et al. ........ 714/774 |
| 8,499,217 | B2 | * | 7/2013 | Song et al. ................. 714/758 |
| 8,595,594 | B2 | * | 11/2013 | Liang ......................... 714/766 |
| 2009/0177931 | A1 | | 7/2009 | Song et al. |
| 2012/0320672 | A1 | | 12/2012 | Meir et al. |

FOREIGN PATENT DOCUMENTS

WO     2009032945     3/2009

OTHER PUBLICATIONS

International Search Report and Written Opinion from PCT/US2014/010344, mailed May 2, 2014, Apple Inc., pp. 1-14.

* cited by examiner

*Primary Examiner* — Joseph D Torres
(74) *Attorney, Agent, or Firm* — Meyertons, Hood, Kivlin, Kowert & Goetzel, P.C.

(57) ABSTRACT

A method includes, in a memory controller that controls a memory, receiving from a host a read command that specifies data to be retrieved from the memory and further specifies a target error performance to be achieved in retrieving the data. A data retrieval configuration is selected in the memory controller depending on the target error performance specified in the read command. The data is retrieved from the memory using the selected data retrieval configuration, and the retrieved data is output to the host.

20 Claims, 1 Drawing Sheet

A MEMORY CONTROLLER RECEIVES A READ COMMAND FROM A HOST SPECIFYING DATA TO BE RECEIVED AND A TARGET ERROR PERFORMANCE FOR THE RETRIEVED DATA — 100

MEMORY CONTROLLER SELECTS A DATA RETRIEVAL CONFIGURATION DEPENDING ON THE TARGET ERROR PERFORMANCE — 110

MEMORY CONTROLLER RETRIEVES THE DATA USING THE SELECTED RETRIEVAL CONFIGURATION AND OUTPUTS THE DATA TO THE HOST — 120

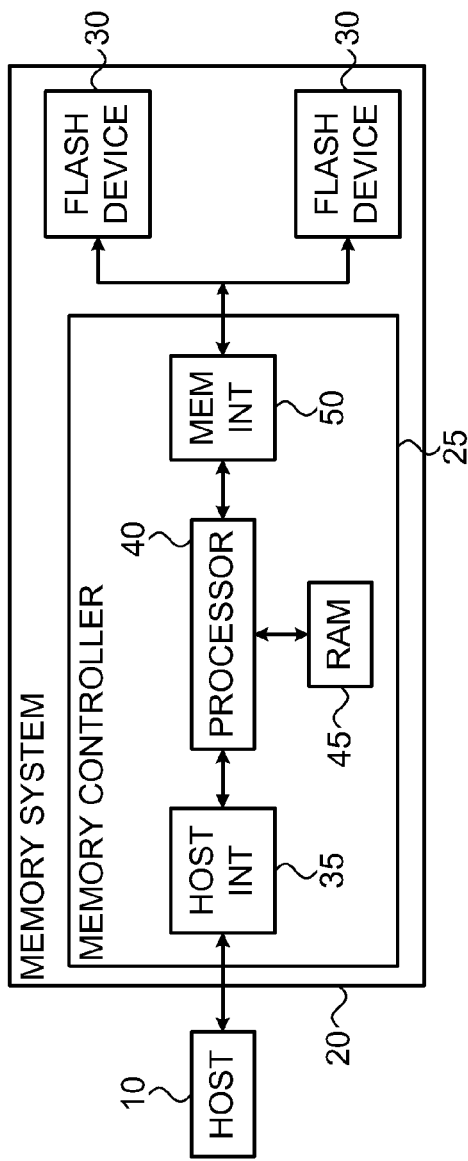

READ COMMANDS SPECIFYING ERROR PERFORMANCE

FIELD OF THE INVENTION

The present invention relates generally to memory systems, and particularly to retrieving data from memory with a controlled error performance.

BACKGROUND OF THE INVENTION

Memory devices such as Flash devices are typically required to store data with high reliability, i.e., to enable data retrieval with a low error rate. Low error rates are achieved, for example, by encoding the stored data with an Error Correction Code (ECC).

For example, U.S. Patent Application Publication 2009/0177931, whose disclosure is incorporated herein, describes memory devices and/or error control codes (ECC) decoding methods. A memory device may include a memory cell array, and a decoder to perform hard decision decoding of first data read from the memory cell array by a first read scheme, and to generate output data and error information of the output data. The memory device may also include a control unit to determine an error rate of the output data based on the error information, and to determine whether to transmit an additional read command for soft decision decoding to the memory cell array based on the error rate. An ECC decoding time may be reduced through such a memory device.

U.S. Pat. No. 8,122,323, whose disclosure is incorporated by reference, describes a method, apparatus, and system for dynamic adjustment of an error control coding (ECC) code rate. In one embodiment, a code rate may be changed from a first code rate to a second code rate in response to a change in a bit error rate.

SUMMARY OF THE INVENTION

An embodiment of the present invention that is described herein provides a method including in a memory controller that controls a memory, receiving from a host a read command that specifies data to be retrieved from the memory and further specifies a target error performance to be achieved in retrieving the data. A data retrieval configuration is selected in the memory controller depending on the target error performance specified in the read command. The data is retrieved from the memory using the selected data retrieval configuration, and the retrieved data is output to the host.

In some embodiments, the target error performance includes a bit error rate (BER) of the retrieved data. In other embodiments, the target error performance includes a Means Square Error (MSE) metric calculated over the retrieved data.

In some embodiments, the stored data is encoded with an Error Correction Code (ECC), retrieving the data includes decoding the ECC in an iterative decoding process that progressively reduces an actual error performance of the decoded data, and selecting the data retrieval configuration includes terminating the iterative decoding process depending on the target error performance. In other embodiments, the ECC is representable by a set of check equations, and terminating the iterative decoding process includes estimating a number of the check equations that are not satisfied by the decoded data, and terminating the iterative decoding process based on the estimated number.

In some embodiments, the stored data is encoded with an Error Correction Code (ECC), and selecting the data retrieval configuration includes deciding, depending on the target error performance, whether or not to disregard an error floor event of a decoding process used for decoding the ECC. In other embodiments, the stored data is subject to inter-cell interference among memory cells of the memory, and selecting the data retrieval configuration includes deciding, depending on the target error performance, whether or not to activate an interference cancellation scheme that cancels the inter-cell interference. In yet other embodiments, outputting the data includes indicating to the host whether the memory controller is capable of retrieving the data with better error performance than that achieved in the outputted data.

The method includes receiving an additional request from the host to retrieve the data with the better error performance, and, in response to the additional request, modifying the data retrieval configuration and re-retrieving the data using the modified data retrieval configuration. The method also includes assigning an area in the memory for storing the target error performance specified in the read command.

There is additionally provided herein, in accordance with an embodiment of the invention, an apparatus including a memory and a processor. The processor is configured to receive from a host a read command that specifies data to be retrieved from the memory and further specifies a target error performance to be achieved in retrieving the data, to select a data retrieval configuration depending on the target error performance specified in the read command, to retrieve the data from the memory using the selected data retrieval configuration and to output the retrieved data to the host.

The present invention will be more fully understood from the following detailed description of the embodiments thereof, taken together with the drawings in which:

BRIEF DESCRIPTION OF THE DRAWINGS

FIG. 1 is a block diagram that schematically illustrates a memory system, in accordance with an embodiment of the present invention; and FIG. 2 is a flow chart that schematically illustrates a method for retrieving data from a memory system based on a target error performance, in accordance with an embodiment of the present invention.

DETAILED DESCRIPTION OF EMBODIMENTS

Overview

Embodiments of the present invention that are described herein provide improved methods and systems for reading data from non-volatile memory. The disclosed techniques enable a host to trade error performance for other performance measures such as latency or power consumption.

In some disclosed embodiments, a memory controller stores data in a memory on behalf of a host. The host and the memory controller support a read command, in which the host specifies the target error performance (e.g., Bit Error Rate—BER) to be achieved in retrieving the data from the memory. Upon receiving such a read command, the memory controller selects a data retrieval configuration depending on the target error performance, and retrieves the data using the selected configuration.

Various examples of retrieval configurations that trade error performance for other performance measures are described herein. In some embodiments the memory controller performs early termination of an iterative ECC decoding process, upon reaching the desired error performance. In other embodiments the memory controller tolerates a residual error floor event of the ECC decoding process, when the residual error performance is below the target error performance. In other embodiments the memory controller decides whether or not to carry out an interference cancellation process depending on the target error performance.

In some embodiments, when responding to a read command, the memory controller indicates to the host whether the data was retrieved with the best achievable error performance or not. In other words, the controller indicates to the host whether or not it has exhausted its error correction capabilities. In response, the host may decide that the achieved error performance is insufficient, and instruct the host to retrieve the data again with improved error performance.

The flexibility in choosing the data retrieval configuration is useful in a variety of applications and use cases. For example, some applications and data types (e.g., real-time video) are relatively tolerant to errors but on the other hand have strict latency requirements. Other applications (e.g., storage of operating system data) are highly intolerant to errors, even at the price of higher latency. When using the disclosed techniques, the memory controller has the freedom to match the data retrieval configuration to the target error performance, while investing only the necessary resources and incurring only the necessary latency.

System Description

FIG. 1 is a block diagram that schematically illustrates a memory system 20, in accordance with an embodiment of the present invention. A host 10 sends data for storage and conversely receives data retrieved from storage from memory system 20. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

Memory system 20 comprises a memory controller 25 which reads and writes data to a non-volatile memory, in the present example one or more Flash memory devices 30. Controller 25 comprises a host interface 35 for communicating with host 10, a processor 40 that carries out the methods described herein, a Random Access Memory (RAM) 45, and a memory interface 50 for communicating with Flash devices 30.

In alternative embodiments, the non-volatile memory in memory system 20 may comprise any other suitable type of non-volatile memory, such as, for example, NOR Flash, Charge Trap Flash (CTF), Phase Change RAM (PRAM), Magneto-resistive RAM (MRAM) or Ferroelectric RAM (FeRAM).

Each Flash device comprises multiple analog memory cells. Each analog memory cell stores an analog voltage, also referred to as a storage value, such as an electrical charge or voltage, which represents the information stored in the cell. In Flash memories, the range of possible analog values is divided into regions, each region corresponding to one or more data bit values. Data is written to analog memory cells by writing a nominal analog value that corresponds to the desired bit or bits.

The analog values stored in the memory cells, and thus the stored data, are subject to various impairments after the data is written which shift the stored analog values. The shifted analog values due to these impairments can result in errors and loss of data.

To compensate for the impairments and to ensure that the stored data can be reliably retrieved from the memory cells, processor 40 encodes the stored data with an Error Correction Code (ECC) which provides data redundancy. During data retrieval, processor 40 decodes the ECC to reconstruct the original data.

Controller 25, and in particular processor 40, may be implemented in hardware. Alternatively, the controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows two memory devices 30, system 20 may comprise any desired number of memory devices that are controlled by memory controller 25. In the exemplary system configuration shown in FIG. 1, memory devices 30 and memory controller 25 are implemented as two separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory devices are disposed. Further alternatively, some or all of the functionality of memory controller 25 can be implemented in software and carried out by a processor or other element of the host system. In some embodiments, host 10 and memory controller 25 may be fabricated on the same die, or on separate dies in the same device package.

In some embodiments, memory controller 25 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Retrieving Data With A Specified Target Error Performance

In some embodiments, host 10 requests system 20 to retrieve certain data. The host decides, for any suitable reason, that the data is to be retrieved with a certain target error performance. The host thus sends to memory controller 25 a read command that specifies the data to be retrieved (e.g., a memory address where the data is to be found), and also specifies the target error performance.

In the description that follows, the error performance is specified as a target Bit Error Rate (BER). Alternatively, however, the host may specify the target error performance in any other suitable way. Upon receiving the read command, the memory controller selects the data retrieval configuration such that the encoded data stored in memory is fetched and decoded with an algorithm which ensures that the target BER is met.

A low, or more stringent BER typically increases read latency and/or power consumption. A large, or less stringent BER can be tolerated for some applications, and thus can be used by the processor to reduce the read latency and power consumption by choosing a different decoding algorithm as will be discussed later. The memory controller typically chooses the algorithm that will meet the target BER with minimal latency and resource allocation.

FIG. 2 is a flow chart that schematically illustrates a method for retrieving data from memory system 20 based on a target error performance, in accordance with an embodiment of the present invention. In a receiving step 100, memory controller 25 receives a read command from host 10 specifying data to be received and a target error performance for the retrieved data. In a selecting step 110, memory controller 25 selects a data retrieval configuration depending on the target error performance. Finally in a retrieving step 120, memory controller 25 retrieves the data using the selected retrieval configuration and outputs the data to host 10.

Typically, memory controller 25 supports a set of two or more data retrieval configurations, which have different error performance levels and may be chosen based on the specified target BER. The data retrieval configurations may differ from one another in the algorithm or process they perform, and/or in parameter values. Several examples are given below for the sake of conceptual clarity. Alternatively, however, memory controller 25 may use any other suitable set of data retrieval configurations.

In some embodiments, the stored data is encoded using an Error Correction Code (ECC). One special class of codes that are commonly used in nonvolatile memory systems is Low Density Parity Check (LDPC) codes. Other classes of codes such as Bose-Chaudhuri-Hocquenghem (BCH) codes may also be used.

Some types of ECC, including LDPC, are typically decoded using iterative decoding processes in which the BER progressively decreases as the decoding process progresses. In a typical LDPC decoding algorithm, code word bits are represented by respective bit nodes, parity equations are represented by respective check nodes, and the decoding algorithm attempts to converge to a valid code word by exchanging messages between the bit nodes and check nodes. The term "iteration" or "decoding iteration" is used herein to refer to a single scan over the set of bit nodes and set of parity equations (and thus the entire set of check nodes). Some iterative decoding processes perform a sequence of decoding iterations, until decoding is successful or until meeting some termination criterion. Note that some decoding schemes may skip certain bit or check nodes. Thus, a decoding iteration can also be defined as the operations performed between successive visits to a certain bit node or check node.

The number of iterations performed determines the latency and the power consumption of the decoding process. Thus, in some embodiments processor 40 updates its estimate of the actual BER as the decoding process progresses, e.g., following each iteration. Based on the estimated BER and the specified target BER, the processor decides whether to terminate the iterative process or to proceed to the next iteration.

In some embodiments, execution of a read command involves a sequence of decoding attempts where each decoding attempt may utilize a different decoder in the memory system and/or different numbers of samples per cell. The various decoding attempts may exhibit different tradeoffs between latency and strength of the error correction. Some decoding attempts may involve preprocessing steps such as modifying log likelihood ratios. Some decoding attempts may depend on the output of previous decoding attempts. Some decoding attempts may be carried out in parallel to others. When using the techniques described herein, if the actual estimated BER is already better than the target BER, many decoding attempts can be eliminated, or the sequence of the decoding attempts can be modified which further improves latency and power consumption.

Typically, the selected data retrieval configuration also comprises a respective termination criterion for terminating the decoding process. In some embodiments, processor 40 evaluates the criterion by verifying whether the estimated actual BER is less than the target BER. In other embodiments the processor requires that the estimated actual BER will be lower than the target BER by a certain margin.

Any suitable method or criterion may be used by processor 40 to select the number of decoding iterations and decide whether to terminate the decoding process. In some embodiments, the ECC is represented by a set of check equations. The number of check equations that are not satisfied by the decoded data at a given time can be used as an estimate of the actual BER. This estimate is referred to as "syndrome sum" (when the syndrome sum equals zero, the data is decoded without errors).

In some embodiments, processor 40 updates the syndrome sum as the decoding process progresses, e.g., following each decoding iteration. The decoding process is terminated when the syndrome sum falls below a certain threshold. The threshold typically depends on the target BER.

The correlation between syndrome sum and the BER of the code word can be computed or fetched from a lookup table stored for example in memory 45, for example. Thus when the syndrome sum is below a certain threshold related to the target BER, the decoding process can be terminated. The retrieved data is then output to the host. Note that the syndrome sum is not a deterministic function of the number of errors in the code word, so an appropriate margin should typically be taken in correlating the number of errors to the syndrome sum.

In some cases the iterative decoding process encounters an error floor event where the BER (error performance) associated with the hard decisions on the decoded bits no longer decreases as the decoding process progresses. The error floor event may prevent the decoding process from converging within a specified limit on the decoding process duration. In the presence of some error floor events, the decoder may never converge. Various techniques are known in the art for mitigating or overcoming such error floor events. Such techniques, however, involve additional computations and therefore increase latency and power consumption.

In some cases, however, the number of bit errors related to the error floor event is sufficiently low to meet the specified target BER. Thus, in some embodiments, processor 40 decides, based on the target BER, whether or not to disregard the error floor event and terminate the decoding process without mitigating it.

In other embodiments, processor 40 may choose, depending on the target BER, whether or not to activate inter-cell interference cancellation. Inter-cell interference (ICI) is an impairment in non-volatile memory, such as Flash memory, whereby charge stored in one memory cell in the memory cell array affects the an adjacent memory cell thus shifting the analog value stored in the memory cells.

Numerous inter-cell interference cancellation schemes have been developed to mitigate the effect of ICI, and any suitable technique can be used in system 20. In some embodiments, processor 40 chooses to activate ICI cancellation if the specified target BER is low (e.g., lower than a threshold) and to deactivate ICI cancellation if the specified target BER is high (e.g., lower than the threshold). Consequently, higher latency and power consumption are incurred only when needed.

In some embodiments, the memory controller reports to the host an actual error performance achieved in retrieving the data. The controller may further report to the host that the memory controller is capable of retrieving the data with better error performance than that achieved in the outputted data. This technique enables the host to decide if the actual error performance in retrieving is adequate for the given application for which the host requested the data.

If the report indicates that the memory controller is capable of achieving a better error performance, the host may send an additional request to the controller to retrieve the data again with better error performance. In response to such a request, the memory controller typically modifies the data retrieval configuration to a more stringent one, and then re-retrieves the data.

Although the embodiments described herein refer mainly to BER as the target error performance measure, various other measures can be used. One example of such a measure is a Means Square Error (MSE) metric. In such embodiments, the host may request the memory controller to retrieve a set of code words, where each code word is assigned a weight. The target error performance may depend on a weighted sum of the errors over all of the code words in the set, where each error is weighted by the weight of its respective code word.

Although the embodiments described herein mainly address method for improving read latency in non-volatile memory system, the methods and systems described herein can also be used in any suitable memory system.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
in a memory controller that controls a memory, receiving from a host a read command that specifies data to be retrieved from the memory and further specifies a target error performance to be achieved in retrieving the data;
selecting in the memory controller a data retrieval configuration depending on the target error performance specified in the read command; and
retrieving the data from the memory using the selected data retrieval configuration, and outputting the retrieved data to the host.

2. The method according to claim 1, wherein the target error performance comprises a bit error rate (BER) of the retrieved data.

3. The method according to claim 1, wherein the target error performance comprises a Means Square Error (MSE) metric calculated over the retrieved data.

4. The method according to claim 1, wherein the stored data is encoded with an Error Correction Code (ECC), wherein retrieving the data comprises decoding the ECC in an iterative decoding process that progressively reduces an actual error performance of the decoded data, and wherein selecting the data retrieval configuration comprises terminating the iterative decoding process depending on the target error performance.

5. The method according to claim 4, wherein the ECC is representable by a set of check equations, and wherein terminating the iterative decoding process comprises estimating a number of the check equations that are not satisfied by the decoded data, and terminating the iterative decoding process based on the estimated number.

6. The method according to claim 1, wherein the stored data is encoded with an Error Correction Code (ECC), and wherein selecting the data retrieval configuration comprises deciding, depending on the target error performance, whether or not to disregard an error floor event of a decoding process used for decoding the ECC.

7. The method according to claim 1, wherein the stored data is subject to inter-cell interference among memory cells of the memory, and wherein selecting the data retrieval configuration comprises deciding, depending on the target error performance, whether or not to activate an interference cancellation scheme that cancels the inter-cell interference.

8. The method according to claim 1, wherein outputting the data comprises indicating to the host whether the memory controller is capable of retrieving the data with better error performance than that achieved in the outputted data.

9. The method according to claim 1, and comprising receiving an additional request from the host to retrieve the data with the better error performance, and, in response to the additional request, modifying the data retrieval configuration and re-retrieving the data using the modified data retrieval configuration.

10. The method according to claim 1, and comprising assigning an area in the memory for storing the target error performance specified in the read command.

11. An apparatus, comprising:
a memory; and
a processor, which is configured to receive from a host a read command that specifies data to be retrieved from the memory and further specifies a target error performance to be achieved in retrieving the data, to select a data retrieval configuration depending on the target error performance specified in the read command, to retrieve the data from the memory using the selected data retrieval configuration and to output the retrieved data to the host.

12. The apparatus according to claim 11, wherein the target error performance comprises a bit error rate (BER) of the retrieved data.

13. The apparatus according to claim 11, wherein the target error performance comprises a Means Square Error (MSE) metric calculated over the retrieved data.

14. The apparatus according to claim 11, wherein the stored data is encoded with an Error Correction Code (ECC), wherein retrieving the data comprises decoding the ECC in an iterative decoding process that progressively reduces an actual error performance of the decoded data, and wherein selecting the data retrieval configuration comprises terminating the iterative decoding process depending on the target error performance.

15. The apparatus according to claim 14, wherein the ECC is representable by a set of check equations, and wherein terminating the iterative decoding process comprises estimating a number of the check equations that are not satisfied by the decoded data, and terminating the iterative decoding process based on the estimated number.

16. The apparatus according to claim 11, wherein the stored data is encoded with an Error Correction Code (ECC), and wherein selecting the data retrieval configuration comprises deciding, depending on the target error performance, whether or not to disregard an error floor event of a decoding process used for decoding the ECC.

17. The apparatus according to claim 11, wherein the stored data is subject to inter-cell interference among memory cells of the memory, and wherein selecting the data retrieval configuration comprises deciding, depending on the target error performance, whether or not to activate an interference cancellation scheme that cancels the inter-cell interference.

18. The apparatus according to claim 11, wherein outputting the data comprises indicating to the host whether the memory controller is capable of retrieving the data with better error performance than that achieved in the outputted data.

19. The apparatus according to claim 11, and comprising receiving an additional request from the host to retrieve the data with the better error performance, and, in response to the additional request, modifying the data retrieval configuration and re-retrieving the data using the modified data retrieval configuration.

20. The apparatus according to claim 11, and comprising assigning an area in the memory for storing the target error performance specified in the read command.

\* \* \* \* \*